United States Patent
Rinner et al.

(10) Patent No.: US 9,873,952 B2
(45) Date of Patent: Jan. 23, 2018

(54) METHOD OF PRODUCING A CERAMIC COMPONENT HAVING A MAIN BODY WITH INTERNAL ELECTRODES

(71) Applicant: EPCOS AG, München (DE)

(72) Inventors: Franz Rinner, Deutschlandsberg (AT); Christoph Auer, Graz (AT); Christian Hoffmann, Munich (DE)

(73) Assignee: EPOS AG (DE)

( * ) Notice: Subject to any disclaimer, the term of this patent is extended or adjusted under 35 U.S.C. 154(b) by 238 days.

(21) Appl. No.: 14/406,622

(22) PCT Filed: May 28, 2013

(86) PCT No.: PCT/EP2013/060975
§ 371 (c)(1),
(2) Date: Dec. 9, 2014

(87) PCT Pub. No.: WO2013/189701
PCT Pub. Date: Dec. 27, 2013

(65) Prior Publication Data
US 2015/0203982 A1    Jul. 23, 2015

(30) Foreign Application Priority Data

Jun. 19, 2012 (DE) .......................... 10 2012 105 318

(51) Int. Cl.
*H01G 7/00* (2006.01)
*C25D 13/12* (2006.01)
(Continued)

(52) U.S. Cl.
CPC ............ *C25D 13/12* (2013.01); *H01G 4/012* (2013.01); *H01G 4/12* (2013.01); *H01G 4/232* (2013.01);
(Continued)

(58) Field of Classification Search
CPC .......... C25D 13/12; H01G 4/012; H01G 4/12; H01G 4/232; H01G 4/30; H01L 41/0471; H01L 41/0472
See application file for complete search history.

(56) References Cited

U.S. PATENT DOCUMENTS 4,681,667 A    7/1987   Utsumi et al.
4,932,119 A *  6/1990   Ealey ................... H01L 41/083
                                                29/25.35

(Continued)

FOREIGN PATENT DOCUMENTS

DE    10 2006 003 070     3/2007
DE    10 2007 004 893     8/2008

(Continued)

OTHER PUBLICATIONS

Japanese Notice of Reasons for Refusal dated Feb. 10, 2016 from corresponding Japanese Patent Application No. 2015-517651 along with a partial English translation of the Notice.

*Primary Examiner* — Minh Trinh
(74) *Attorney, Agent, or Firm* — DLA Piper LLP (US)

(57) ABSTRACT

A method of producing a ceramic component includes a) providing a main body having internal electrodes, outer edges of which are located on at least one first outer surface of the main body, b) contacting the first outer surface of the main body with a composition including an electrophoretically mobile insulating material and electrophoretically depositing the insulating material on outer edges of the internal electrodes on the first outer surface of the main body, and c) producing an insulating layer from the insulating material on the outer edges of the internal electrodes.

12 Claims, 4 Drawing Sheets

(51) Int. Cl.
*H01G 4/232* (2006.01)
*H01L 41/047* (2006.01)
*H01L 41/293* (2013.01)
*H01G 4/012* (2006.01)
*H01G 4/12* (2006.01)
*H01G 4/30* (2006.01)
*H01L 41/09* (2006.01)
*H01L 41/273* (2013.01)

(52) U.S. Cl.
CPC ........... *H01G 4/30* (2013.01); *H01L 41/0471*
(2013.01); *H01L 41/0472* (2013.01); *H01L*
*41/09* (2013.01); *H01L 41/273* (2013.01);
*H01L 41/293* (2013.01)

(56) References Cited

U.S. PATENT DOCUMENTS

| | | | |
|---|---|---|---|
| 5,173,162 A | 12/1992 | Hagimura et al. | |
| 5,597,494 A | 1/1997 | Kohno et al. | |
| 6,118,647 A * | 9/2000 | Okinaka | H01G 4/005 |
| | | | 29/25.35 |
| 7,087,970 B2 * | 8/2006 | Nakamura | H01L 41/0471 |
| | | | 257/414 |
| 7,273,502 B2 * | 9/2007 | Choi | H01G 4/005 |
| | | | 29/25.03 |
| 8,904,610 B2 * | 12/2014 | Abe | H01G 4/012 |
| | | | 29/25.03 |
| 2010/0282874 A1 * | 11/2010 | Nakamura | H01L 41/0471 |
| | | | 239/585.1 |

FOREIGN PATENT DOCUMENTS

| | | |
|---|---|---|
| DE | 600 38 276 | 3/2009 |
| DE | 10 2007 058 873 | 6/2009 |
| DE | 10 2010 063 205 | 6/2012 |
| EP | 0 167 392 | 1/1986 |
| EP | 0 407 099 | 1/1991 |
| EP | 1 107 325 | 6/2001 |
| JP | 60-178678 | 12/1985 |
| JP | 61-27687 | 7/1986 |
| JP | 63-32976 | 12/1988 |
| JP | 3-38076 | 2/1991 |
| JP | 8-148142 | 6/1996 |
| JP | 2001-196656 | 7/2001 |
| JP | 2010-172886 | 12/2010 |

* cited by examiner

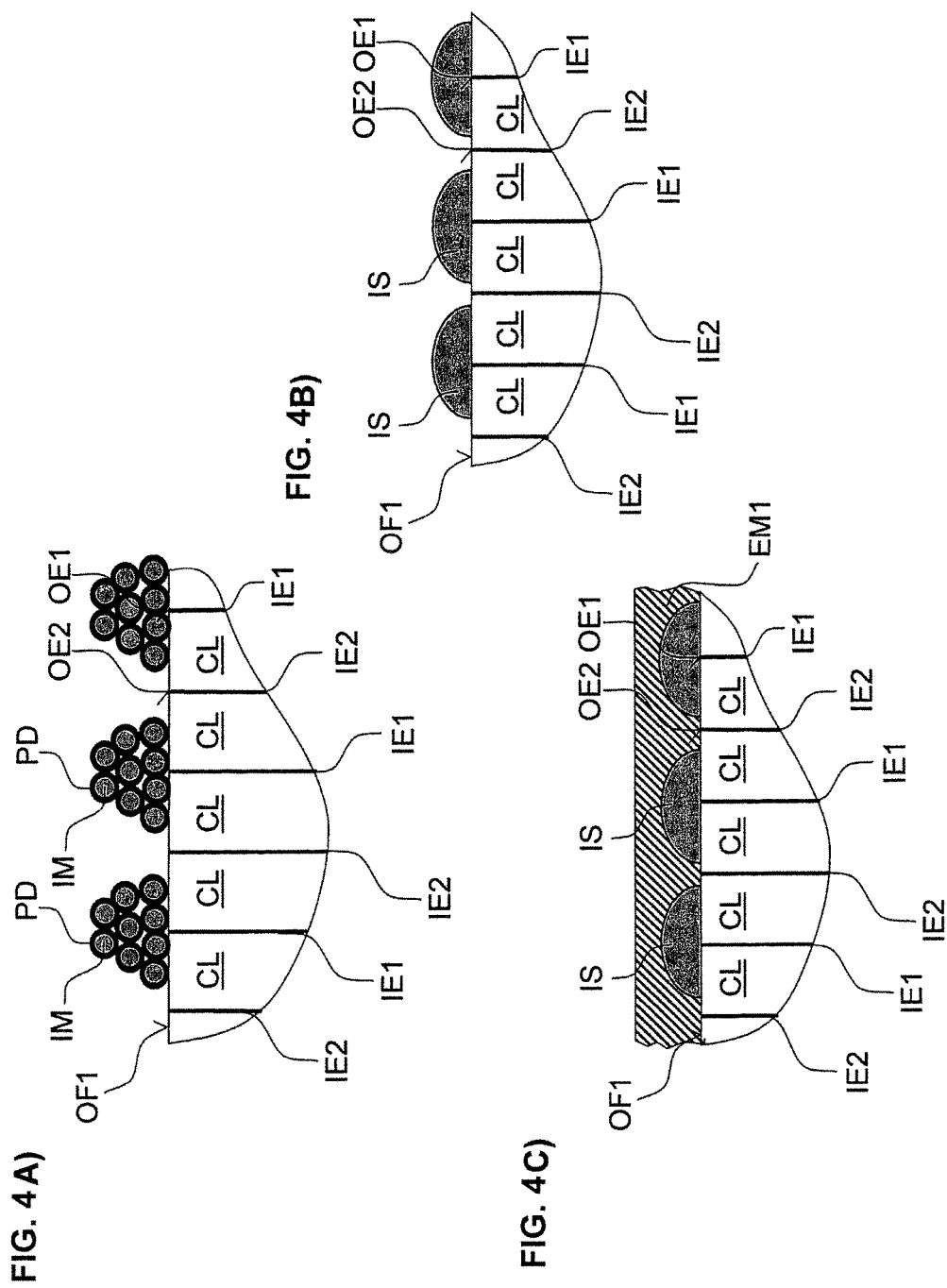

METHOD OF PRODUCING A CERAMIC COMPONENT HAVING A MAIN BODY WITH INTERNAL ELECTRODES

TECHNICAL FIELD

This disclosure relates to a method of producing a ceramic component and also to a ceramic component. The component can be, for example, a component part of a piezoactuator. By way of example, the component can be produced by multi-layer technology. Piezoactuators of this type produced by multi-layer technology can be used, for example, in fuel injection systems of motor vehicles.

BACKGROUND

DE 102006003070 B3 discloses a method of producing an electronic component in the form of a stack having a plurality of electrode layers and ceramic layers in which an insulating material is patterned by a laser. DE 102007058873 A1 discloses a piezoactuator having an insulating layer in which the insulating layer is laminated on as a prepatterned sheet or a photosensitive insulating sheet which has been laminated on is subsequently photopatterned. U.S. Pat. No. 5,597,494 proposes an electronic multi-layer component in which the regions of inner electrodes close to the surface are electrochemically etched back and the recesses formed are filled with an insulating material. These methods comprise a multiplicity of separate processing steps and are complicated and expensive in implementation both in terms of technology and in terms of apparatus.

It could therefore be helpful to provide an improved method of producing a ceramic component and an improved ceramic component.

SUMMARY

We provide a method of producing a ceramic component, including: a) providing a main body having internal electrodes, outer edges of which are located on at least one first outer surface of the main body, b) contacting the first outer surface of the main body with a composition comprising an electrophoretically mobile insulating material and electrophoretically depositing the insulating material on outer edges of the internal electrodes on the first outer surface of the main body, and c) producing an insulating layer from the insulating material on the outer edges of the internal electrodes.

We also provide a ceramic component including a main body having internal electrodes comprising at least one first internal electrode having first outer edges and at least one second internal electrode having second outer edges, wherein the first and second outer edges are located on at least one first and one second outer surface of the main body, and an electrically insulating layer on the outer edges of the internal electrodes, wherein the insulating layer on the first outer surface is located substantially only on the first outer edges and not on the second outer edges and on the second outer surface is located substantially only on the second outer edges and not on the first outer edges.

We further provide a ceramic component obtainable by the method.

BRIEF DESCRIPTION OF THE DRAWINGS

FIG. 4A shows, in a sectional view, the component in an intermediate state of the method after method step b) after the electrophoretic deposition of insulating material.

FIG. 4B shows, in a sectional view, the component in a further intermediate state of the method after method step c) after the production of the insulating layer.

FIG. 4C shows, in a sectional view, the component in a further intermediate state of the method after method step d) after the application of an outer metallization.

LIST OF REFERENCE SIGNS

Figure 1:
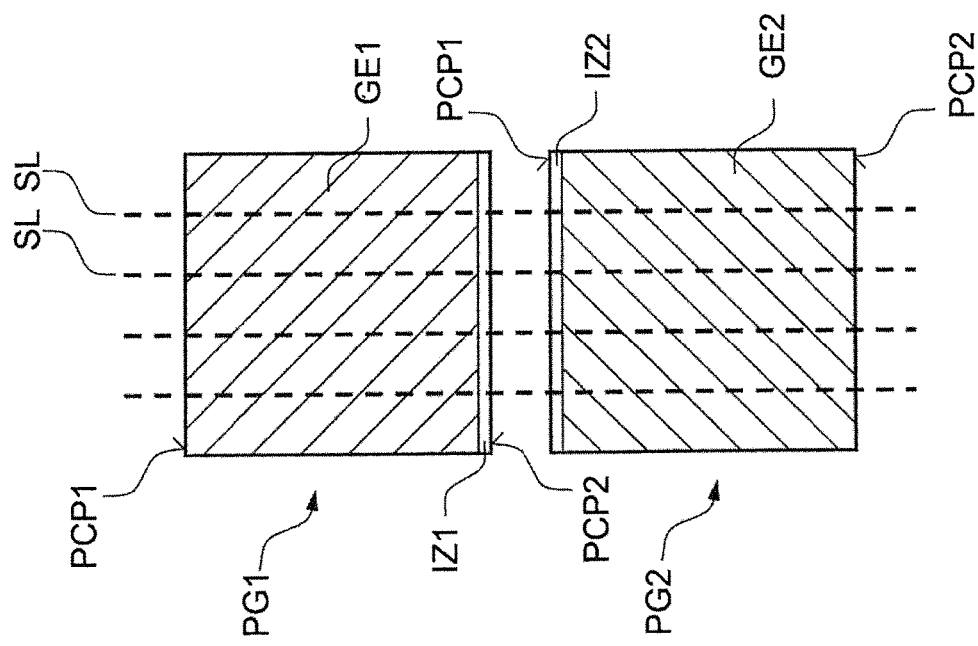
FIG. 1 shows an example for first and second green sheets.

PG1 First green sheet
PG2 Second green sheet
IZ1 First insulating zone
IZ2 Second insulating zone
GE1 First electrode layer
GE2 Second electrode layer
PCP1 First preliminary outer contact face
PCP2 Second preliminary outer contact face
PC1 First preliminary outer contact-making means
PC2 Second preliminary outer contact-making means
SL Schematic separating lines for green stack
SBA Ceramic main body arrangement
SB Ceramic main body
IE1 First internal electrode
IE2 Second internal electrode
OE1 First outer edges
OE2 Second outer edges
CL Ceramic layer
OF1 First outer surface
OF2 Second outer surface
OF3 Third outer surface
OF4 Fourth outer surface
SP Schematic separating lines for main body arrangement
EC Composition comprising an electrophoretically mobile insulating material
IM Insulating material
IS Insulating layer
CE Counterelectrode
EM1 First electrical outer contact-making means
EM2 Second electrical outer contact-making means
PD Polyionic dispersant

DETAILED DESCRIPTION

We provide a method of producing a ceramic component. The method comprises in a method step a) providing a main body having internal electrodes, the outer edges of which are located on at least one first outer surface of the main body. In the following method step b), the first outer surface of the main body is contacted with a composition comprising an electrophoretically mobile insulating material. The insulating material is subsequently deposited electrophoretically on the outer edges of the internal electrodes on the first outer surface of the main body. In a further method step c), an insulating layer is produced from the insulating material on the outer edges of the internal electrodes.

A significant advantage of the method is that the electrophoretic deposition simultaneously achieves patterning of the insulating material on the outer edges of the internal electrodes. In particular, it is thereby possible to dispense with further patterning measures such as prepatterning of the outer edges of the internal electrodes and/or of the outer surface as is common, for example, by lithographic methods or material removal methods. Since patterned deposition by electrophoresis is limited substantially to the region of the outer edges of the internal electrodes, it is also possible, for example, to dispense with repatterning of the insulating layer as is required in conventional methods, for example, by the targeted removal of insulating material. In particular, our method can have economical advantages for these reasons since it is possible to dispense with complex process steps such as prepatterning and/or repatterning of the insulating layer.

The main body can be, for example, a monolithic ceramic body, into which internal electrodes are introduced. The main body can also have ceramic layers. The internal electrodes can be in the form of internal electrode layers. By way of example, the main body can have a stack of ceramic layers and internal electrode layers. The main body can be produced, for example, by multi-layer technology such that ceramic layers and internal electrode layers alternate in the stack, in that at least one ceramic layer is located between in each case two internal electrode layers. In certain embodiments, it is also possible for a plurality of ceramic layers to be located between two internal electrode layers.

The main body can be produced, for example, as a monolithic body by multi-layer technology, in that ceramic green sheets and internal electrode layers are sintered together. It is preferable that the main body of the ceramic component and in the method of producing it is provided by such a monolithic sintered body.

The electrophoretic deposition is based on the principle that an electrophoretically mobile insulating material is arranged in a patterned form in accordance with its electrical charge in an electric field along a voltage difference on the outer edges, on account of different electrical potentials of these outer edges. An electrophoretically mobile insulating material comprises insulating material with an electrical net charge. By way of example, the insulating material can have a positive net charge. Alternatively, the insulating material can also have a negative net charge. By way of example, the net charge can be a substance property of the insulating material. The net charge can also be generated by external factors, however. By way of example, an electrically charged or uncharged insulating material can also be combined with a further electrically charged material to form an electrophoretically mobile insulating material. Electrophoretically mobile insulating material with a positive net charge migrates in the electric field in the direction of the positive voltage, i.e. toward the cathode, whereas electrophoretically mobile insulating material with a negative net charge moves in the direction of the negative voltage, i.e. toward the anode.

The outer edges of the internal electrodes are understood to mean in particular those marginal regions of internal electrodes present on an outer surface of the main body in particular in the same plane as the outer surface. By way of example, this can involve one or more of the circumferential, flat outer sides of an internal electrode present as an electrode layer. The insulating layer is preferably a layer with electrically insulating properties which can cover one or more outer edges of one or more internal electrodes in an electrically insulating manner.

Preferably, the internal electrodes in the main body comprise at least one first internal electrode having first outer edges and at least one second internal electrode having second outer edges, the first outer edges and the second outer edges being located on at least the first outer surface of the main body. In these examples, in method step b), the insulating material is deposited substantially only on the first outer edges and not on the second outer edges on the first outer surface and, therefore, the first outer edges are present in a manner insulated by the insulating layer on the first outer surface and the second outer edges are at least partially exposed. This makes it possible to achieve, by way of example in a later method step, a selective electrical contact-connection of the second outer edges on the first outer surface. A selective electrical contact-connection of this type can be used, for example, to selectively apply an electrical potential to the at least one second internal electrode.

Further preferably, the first and second outer edges of the first and second internal electrodes are additionally located on at least one further second outer surface of the main body, in particular in the same plane as the second outer surface. In this example, the method provides for contacting the second outer surface with a composition in a method step b') after b), wherein the insulating material on the second outer surface is deposited substantially only on the second outer edges and not on the first outer edges. This makes it possible to achieve, by way of example in a later method step, a selective electrical contact-connection of the at least partially exposed first outer edges on the second outer surface, while here the second outer edges are present in a manner electrically insulated by the insulating layer on the second outer surface. Preferably, it is therefore possible, for example, to selectively apply different electrical potentials to the at least one first and second internal electrode. It is commonly the case that the second outer surface is a further outer face of the main body which differs from the first outer surface. By way of example, the second outer surface is that face of the main body which lies opposite the first outer surface. Alternatively, the first and the second outer surface can also be adjacent faces of the main body. In certain examples, the first and the second outer surface can also be separate regions of the same face of the main body.

It is preferable that the internal electrodes of the main body comprise a plurality of first internal electrodes and a plurality of second internal electrodes. Those examples in which first and second internal electrodes alternate in the main body are indeed exemplary. By way of example, a multiplicity of first internal electrodes and second internal electrodes of alternating sequence are present in the main body, with at least one ceramic layer being arranged in each case between a first internal electrode and a second internal electrode. Accordingly, by way of example in method step b), the insulating material is deposited substantially only on the first outer edges and not on the second outer edges, and therefore at least partially exposed second outer edges and first outer edges with an insulating layer likewise alternate on the first outer surface. Correspondingly, if appropriate in a method step b'), the insulating material is deposited substantially only on the second outer edges and not on the first outer edges, and therefore at least partially exposed first outer edges and second outer edges with an insulating layer alternate on the second outer surface. As an alternative to an alternating sequence, it is also possible for groups of first internal electrodes and groups of second internal electrodes to be present in the main body.

The insulating material is electrophoretically deposited on the first and/or second outer surface of the main body. It is preferable for this purpose, in method step b) and if appropriate in method step b'), that a first electrical potential is applied to the first internal electrodes and a second electrical potential is applied to the second internal electrodes, wherein the first electrical potential and the second electrical potential are of opposing polarity. By way of example, a positive potential can be chosen for the first electrical potential and a negative potential can be chosen for the second electrical potential. Alternatively, a negative potential can be chosen for the first electrical potential and a positive potential can be chosen for the second electrical potential.

Further preferably, in method step b) and/or b'), a third electrical potential is applied to at least one counterelectrode related to the first and second internal electrodes. In this example, in method step b), the first and the third electrical potentials are chosen to be of opposing polarity and the absolute value of the third electrical potential is chosen to be greater than the absolute value of the second electrical potential. Correspondingly, if appropriate in method step b'), the second electrical potential and the third electrical potential are chosen to be of opposing polarity and the absolute value of the third electrical potential is chosen to be greater than the absolute value of the first electrical potential.

The greatest potential difference in method step b) therefore exists between the first internal electrodes and the counterelectrode and the greatest potential difference in method step b') therefore exists between the second internal electrodes and the counterelectrode. The electric field generated by this potential difference is determinative of the direction of movement of the electrophoretically mobile insulating material and also the deposition thereof in method step b) on the first outer edges and, respectively, in method step b') on the second outer edges. The electrical potential EP2 chosen to be of smaller absolute value with respect to the counterelectrode in method step b) and, respectively, the electrical potential EP1 in method step b') each have the same polarity as the potential of the counterelectrode. At the same time, the absolute values of these potentials are chosen such that the movement of the electrophoretically mobile insulating material is not prevented in the far field, that is to say along the electric field between the first internal electrodes and the counterelectrode in method step b) and, respectively, between the second internal electrodes and the counterelectrode in method step b'). In the near field, that is to say in the vicinity of the outer edges of the internal electrodes on the outer surfaces, however, the electrophoretically mobile insulating material is deflected from the second outer edges toward the first outer edges in method step b) and, respectively, from the first outer edges toward the second outer edges in method step b'). In this way, the choice for the potentials achieves the patterned deposition of the electrophoretically mobile insulating material substantially on the first outer edges in method step b) and on the second outer edges in method step b') in a particularly advantageous manner, while the second outer edges in b) and, respectively, the first outer edges in b') remain at least partially exposed. The voltage difference between the first and second internal electrodes in method step b) and, respectively, b') is chosen to be no greater than 50 V and preferably no greater than 30 V, for example. By way of example, in certain examples, 20-100 V, with preference 30-80 V, preferably 40-70 V, can be applied to the internal electrodes intended for deposition in method steps b) or b'). Correspondingly, a voltage of 0-60 V, with preference 10-50 V, preferably 20-40 V, can be applied, for example, to the internal electrodes on which no insulating material is to be deposited. 0 V can be applied, for example, to the counterelectrode. By way of example, 100 V are applied to the internal electrodes intended for deposition, 50 V are applied to the internal electrodes on which no insulating material is to be deposited, and 0 V are applied to the counterelectrode. In a further configuration, by way of example, 60 V are applied to the internal electrodes intended for deposition, 30 V are applied to the internal electrodes on which no insulating material is to be deposited, and 0 V are applied to the counterelectrode.

The method may be configured such that, in a further method step d) after method step b), at least one first electrical outer contact-making means is applied to at least the first outer surface of the main body. Preferably, the electrical outer contact-making means is applied over a large area of the first outer surface over the insulating layer of the first outer edges and the at least partially exposed second outer edges. By way of example, the electrical outer contact-making means can be applied by sputtering. Alternatively, the electrical outer contact-making means can be applied as a metal paste, which is then burned in. By way of example, the metal paste can be applied by the screen printing method. Alternatively, the electrical outer contact-making means can comprise an adhesive paste. The first electrical outer contact-making means can comprise, for example, an electrically conductive, for example a metal-containing or a metallic, material. It is preferable that the first electrical outer contact-making means is applied as a layer. Alternatively, the first electrical outer contact-making means can also be applied in patterned form, however. It is preferable that the first electrical outer contact-making means is arranged such that it produces an electrical collective contact for the second internal electrodes over the electrical contact-connection of the second outer edges on the first outer surface.

Preferably, it is moreover the case that, in a further method step d') after method step b'), at least one second electrical outer contact-making means is applied to at least the second outer surface of the main body. In particular, the second electrical outer contact-making means is applied such that an electrical collective contact is produced for the first internal electrodes over the first outer edges thereof on the second outer surface.

In particular, method steps d) and if appropriate d') can also be effected after method step c). In certain configurations of the method, a further method step c') can also be present, if an insulating layer is produced from the insulating material only on the first outer edges in method step c) and an insulating layer is produced from the insulating material only on the second outer edges in the further method step c'). By way of example, the method can be configured such that, first, method steps b), c) and d) and then method steps b'), c') and d') are effected. Alternatively, the method steps can be effected in the sequence b) and b'), c), d) and d'). By way of example, the method steps can also be effected in the sequence of method steps b) and c), b') and c'), d) and d'). Further, the sequence of method steps b) and b'), d) and d'), c) is provided. Further possible configurations in relation to the sequence of the method steps are provided and are readily evident.

Particular advantages of the method arise by virtue of the fact that the insulating material or the insulating layers produced therefrom is or are deposited in a form patterned by electrophoresis by the method. It is therefore not necessary, for example, to determine the exact position of the insulating layer or of the exposed outer edges intended for contact-connection on an outer surface for method steps d) or d'). By way of example, the electrical outer contact-making means can therefore be applied using particularly simple means over a large area of the respective outer surfaces. The targeted application of the electrical outer contact-making means to predefined sites on the outer surface can be dispensed with. Similarly, on account of the electrophoretically patterned arrangement of the insulating material, the removal of insulating material at predefined sites is not necessary, for example, for the electrical contact-connection of first or second outer edges. Similarly, the method can thereby do without complex apparatus-based arrangements and precision instruments such as, for example, position sensors, controllers and high-precision stepper motors.

A further advantage of the method is the fact that, on account of the electrophoretically patterned deposition of the insulating material, production tolerances of the main body can be inherently compensated for. Individual adaptation of the method to the main body for method steps b) and/or b') and, respectively, d) and/or d') can be dispensed with, for example. During the process of producing the main body, production tolerances can have the effect, for example, that the distances between the internal electrodes are different. Different distances of this nature can be caused, for example, by pressing warpage or different sintering shrinkage during the production of the main body. As a result, there is the risk in known methods that the internal electrodes on an outer surface of the main body are not covered adequately with insulating material or with electrical outer contact-making means. As a result, there is the risk of short circuits and/or incorrect contact-connections. Defective components of this nature usually have to be identified by an electrical measurement and sorted out. Our method ensures a reliable insulation or electrical contact-connection of the in each case first or second outer edges on the outer surfaces of the main body. As a result, it is possible to effectively avoid electrical outer contact-connections of the component in which, for example, one or more first internal electrodes or one or more second internal electrodes are not contact-connected. The method therefore not only reduces the production rejects of incorrectly contact-connected components, but at the same time renders complex quality control measures following the production method unnecessary.

The composition used for the electrophoresis in method step b) and/or b') can contain, for example, particles of the insulating material, a polyionic dispersant and solvent. The polyionic dispersant performs the task, for example, of dispersing the particles of the insulating material in the solvent to form the electrophoretically mobile insulating material. By way of example, the same composition can be used in method steps b) and b') if the first electrical potential in method step b) is of the same polarity as the second electrical potential in method step b'). Alternatively, a different composition can be used in method steps b) and b') if the first electrical potential in method step b) and the second electrical potential in method step b') are of differing polarity.

The particles of the insulating material preferably have a size which can be dispersed in solvent by the polyionic dispersant to form electrophoretically mobile insulating material. It is preferable that particles of this nature have a size in the range of nanometers to micrometers. The particles preferably have a size of 10 nm to 100 µm. Preference is given to particles having a grain size of approximately 0.1 to 10 µm. Further preference is given to particles having a grain size of 0.2 to 5 µm. Particular preference is given to particles which have a grain size of 0.5 to 2 µm.

The polyionic dispersant can comprise, for example, a polyanionic dispersant or a polycationic dispersant. By way of example, use can be made of polyanionic or polycationic organic polymers. The polycationic dispersant used can be, for example, poly(diallyldimethyl)ammonium chloride (PDADMAC) or polyethyleneimine. Suitable polycations are known or are evident. The polycationic dispersant used is preferably PDADMAC. The polyanionic dispersants used can be, for example, polyphosphates, polycarboxylic acids or polysulfonic acids. By way of example, polyacrylic acid can be used. Further suitable polycations are known or are evident.

In addition to polyionic dispersants, use can also be made of ionic surfactants capable of dispersing the particles of the insulating material in solvent to form the electrophoretically mobile insulating material. The ionic surfactants used can be, for example, anionic surfactants. By way of example, use can be made of sodium dodecyl sulfate (SDS). In further examples, use can also be made of cationic surfactants. By way of example, use can be made of surfactants with quaternary ammonium compounds such as, for example, distearyl dimethyl ammonium chloride (DSDMAC).

It is preferable that a polyionic dispersant or alternatively an ionic surfactant is selected such that wetting of the particles of the insulating material is ensured. The polyionic dispersant or the ionic surfactant preferably provides the particles of the insulating material with a surface charge such that, on account of the electrostatic repulsion between the particles of the insulating material, the particles do not form any agglomerates. It is preferable that the polyionic dispersant or the ionic surfactant is selected such that the particles of the insulating material are provided with a net charge, for example, to be able to propel the electrically charged particles of the insulating material through an electric field.

The solvents used can be, for example, aqueous solvents or organic solvents. By way of example, use can be made of water or aqueous buffer solutions. The organic solvents used can be, for example, ethanol, methyl ethyl ketone or butyl acetate. Alternatively, use can be made, for example, of mixtures of aqueous and organic solvents.

According to one example of the method, the particles of the insulating material are selected such that they comprise particles of at least one electrically insulating material selected from the group consisting of glass, ceramic, temperature-resistant plastic and combinations thereof. By way of example, the electrically insulating material can be glass. The electrically insulating material can be, for example, lead-silicate glass. Alternatively, the electrically insulating material can be ceramic material. By way of example, the ceramic material can be a sintered ceramic, for example aluminum oxide. The electrically insulating material can also be a temperature-resistant plastic. By way of example, the temperature-resistant plastic can be an organic electrically insulating material, for example an organic polymer or copolymer. In particular, the organic electrically insulating material can contain a polyolefin, polysiloxane, polyamide, polyester, polystyrene, polyether or polyvinyl chloride.

In certain examples, the polyionic dispersant or the ionic surfactant comprises in particular a polyanionic dispersant or an anionic surfactant, if in method step b) the first internal electrodes and if appropriate in method step b') the second internal electrodes are connected as an anode. As a result, the electrophoretically mobile insulating material migrates in accordance with its negative net charge toward the electrodes connected as the positive pole. In a further example, the polyionic dispersant or the ionic surfactant comprises a polycationic dispersant or a cationic surfactant, if in method step b) the first internal electrodes and if appropriate in method step b') the second internal electrodes are connected as a cathode. In this way, the electrophoretically mobile insulating material migrates in accordance with its positive net charge toward the electrodes connected as the negative pole.

In a further example of the method, use is made of a main body which comprises a piezoceramic material. The piezoceramic material can contain, for example, lead zirconate titanate (PZT). Alternatively, the piezoceramic material can contain a lead-free ceramic. The piezoceramic material can also contain dopants, for example. The main body can comprise piezoceramic layers, for example. The ceramic component can be in the form, for example, of a piezoelectric component of multi-layer construction, for example, in the form of a piezoactuator. In a piezoactuator, it is typically the case that the internal electrodes are arranged one on top of another as electrode layers, with a piezoelectric layer being located between the electrode layers. In this case, a piezoelectric layer can be formed from one or more piezoelectric plies. A piezoelectric layer can also have only a single piezoelectric ply. Through the application of a voltage to the internal electrode layers, the piezoelectric layers between electrode layers of opposing polarity expand such that a stroke of the piezoactuator is generated. The ceramic component can also be in the form of a different component, however, for example in the form of a multi-ply or multi-layer capacitor, which has, for example, a different arrangement of the internal electrodes.

The ceramic component is preferably a fully active component produced by multi-layer technology. In a fully active component, the internal electrodes typically extend as internal electrode layers over the entire cross section of the main body such that the ceramic layers are covered over the entire area thereof by the internal electrode layers. Therefore, the component is in particular free of inactive zones between adjacent electrode layers. An inactive zone is understood here to be a region between two adjacent electrode layers of differing polarity in which the electrode layers do not overlap. There is usually a different expansion of the piezoelectric layers in piezoelectrically inactive zones of this type than in the piezoelectrically active zones, and this can lead to mechanical stresses and generally to the formation of cracks. Formation of cracks in the component usually has to be compensated for by complex structural solutions. By way of example, intermediate layers which tear more readily and thereby enable formation of cracks to be controlled to a certain extent are incorporated in addition to the piezoelectric layers. It is disadvantageous that there is a loss of active length of the piezoelectric component through the incorporation of intermediate layers. Inactive zones and also the loss of active length equally lead to a loss of active area and therefore have a disadvantageous effect on the piezoelectric elongation or blocking force of the component. There correspondingly results an increased space requirement of components with inactive zones to compensate for the loss of the stroke capacity and the blocking force. Inactive zones arise, for example, in conventional production methods, if, for the purpose of the selective electrical contact-connection of electrode layers, the latter are not printed completely onto the corresponding ceramic layer, but rather are spaced apart in an electrically insulating manner from at least one outer contact side. Inactive zones of this type do not arise since according to the methods the insulating layer is located on the outer surfaces of the components and therefore replaces the electrically insulating space, and therefore the electrode layers can be printed onto the ceramic layers over the entire area thereof.

Preferably, in method step a), a main body arrangement comprising the ceramic main body is provided, wherein the arrangement additionally has a third outer surface and a fourth outer surface. In this preferred arrangement, the first outer edges of the first internal electrodes are additionally located on the third outer surface and are spaced apart from the fourth outer surface by a first insulating zone. The second outer edges of the second internal electrodes are located on the fourth outer surface in the arrangement and are spaced apart from the third outer surface by a second insulating zone. It is usually the case that the insulating zones comprise the same piezoelectric material as the remainder of the main body. By way of example, the third and fourth outer surfaces are opposing outer sides of the main body. Alternatively, the third and fourth outer surfaces can also be adjacent outer sides of the main body.

The insulating zones bring about an electrically insulating spacing between the first outer edges and the fourth outer surface and, respectively, between the second outer edges and the third outer surface. By way of example, the insulating zones can have a width of 0.1 to 1 mm. The width of the insulating zones is preferably 0.4 to 0.9 mm. The width of the insulating zones is usually chosen depending on the size of the arrangement and also the manufacturing tolerances.

Preferably, preliminary electrical contact is made with the first outer edges by a first preliminary outer contact-making means on the third outer surface of the arrangement. The second outer edges are not electrically contact-connected by the first preliminary outer contact-making means on account of the second insulating zone. Electrical contact is made with the second outer edges by a second preliminary outer contact-making means on the fourth outer surface. The first outer edges are not electrically contact-connected by the second preliminary outer contact-making means on account of the first insulating zone. By virtue of this preferred example, it is possible to selectively provide the first internal electrodes with the first electrical potential and/or the second internal electrodes with the second electrical potential.

By way of example, the main body arrangement can comprise at least two or a plurality of the ceramic main bodies. By way of example, in a final method step, the main body arrangement can be separated into individual, preferably fully active, ceramic components, with the first and second insulating zones also being removed. This method has the advantage that, by virtue of the main body arrangement, only a first and a second insulating zone are required for the selective electrical contact-connection of the first and second outer edges of a plurality of main bodies. In this way, for example, the cutting loss during the subsequent separation into fully active components is reduced compared to conventional methods, in which, for example, each individual main body has a first and a second insulating zone which then have to be removed.

After deposition of the insulating material on the first outer edges of the first outer surface, the main body is usually dried. Then, the deposition can, if appropriate, be repeated on the second outer edges of the second outer side. After that, the deposit can be decarburized and burned out, for example. The decarburization can be effected, depending on the material and the process control, at a temperature of 400-500° C. for 0.5-3 hours, for example. The burning-in process can be effected, depending on the material and the process control, at a temperature of 700-900° C. for 0.5-3 hours, for example, with the insulating layer being formed. Preferably, for example, the decarburization is effected at 450° C. for 0.5-1 hour and the burning-in process is effected over a temperature ramp with a holding time of 0.5 hour at 800° C.

A further example relates to a ceramic component having a main body having internal electrodes. The internal electrodes comprise at least one first internal electrode having first outer edges and at least one second internal electrode having second outer edges. These first and second outer edges are located at least on one first and one second outer surface of the main body. Furthermore, the ceramic component has an electrically insulating layer located on the outer edges of the internal electrodes on the first and second outer surfaces. Here, the insulating layer on the first outer surface is located substantially only on the first outer edges and not on the second outer edges and on the second outer surface is located substantially only on the second outer edges and not on the first outer edges. The patterned arrangement of the insulating material is realized by means of electrophoresis. It is preferable that the ceramic component is produced by the method described above and has the advantages of a ceramic component produced by this method.

The insulating layer may be patterned on the outer edges of the internal electrodes in ridges on account of the electrophoretic deposition method. On account of the electrophoretic patterning, in cross section the ridges are narrower than twice the distance between adjacent outer edges. Through the production of the insulating layer from the electrophoretic deposition of particles of the insulating material by burning-in, the ridges of the insulating layer have a rounded cross section. It is preferable that the ceramic component is produced by a method as described above. The electrophoretic method ensures that the second outer edges on the first outer surface can be electrically contact-connected and the first outer edges on the second outer surface can be electrically contact-connected. It is preferable that prepatterning of the outer edges and/or of the outer surface is not required for patterning the insulating layer, for example, by lithography or material removal. It is also preferable that repatterning of the insulating layer, for example, by removal of the insulating layer over the outer edges of the internal electrodes for the electrical contact-connection, is not required. It is preferable that the ceramic component therefore does not have any features of such prepatterning or repatterning. On account of the electrophoretic method, at least some of the particles of the insulating material can remain traceable in the insulating layer after it has been produced. By way of example, some of the polyionic dispersant or of the ionic surfactant can also remain in the insulating layer after it has been produced.

A further example relates to a ceramic component obtainable by the aforementioned method.

The methods of producing a ceramic component and also the ceramic components will be explained by way of example on the basis of schematic figures which are not true to scale. Individual selected elements of the figures may be labeled by reference signs to better indicate them, and recurring elements in some circumstances are not labeled repeatedly for reasons of clarity.

The example below serves the purpose of explaining our methods and components and are not limiting to specific details.

Production of a Fully Active Piezoactuator Component

FIG. 1 shows first and second ceramic green sheets (PG1, PG2) alternately stacked to produce a fully active piezoactuator component. The first and the second green sheets are printed virtually over their entire area with internal electrodes in the form of first and second electrode layers (GE1, GE2), with only a first narrow insulating zone (IZ1) adjoining a second preliminary outer contact side (PCP2) remaining spared from the first electrode layers (GE1) and, respectively, a second narrow insulating zone (IZ2) adjoining a first preliminary outer contact side (PCP1) remaining spared from the second electrode layers (GE2). These insulating zones typically have a width of 0.4 to 0.9 mm. The first electrode layers (GE1) are pulled out onto the first preliminary outer contact side (PCP1), while the second electrode layers (GE2) are pulled out onto the second preliminary outer contact side (PCP2). The green sheets contain, for example, a ceramic powder, an organic binder and a solvent, and can be produced by sheet drawing or sheet casting. The ceramic powder can comprise, for example, a piezoceramic material, for example lead zirconate titanate (PZT) or a lead-free ceramic. The electrode layers can be printed on as a metal paste by the screen printing method, for example. The metal paste can contain, for example, copper or silver-palladium, and therefore internal electrodes are formed as internal electrode layers which contain copper or silver-palladium as the main constituent.

The first and second green sheets (PG1, PG2) are then alternately stacked one on top of another such that the first insulating zones (IZ1) lie on the side of the second preliminary outer contact side (PCP2) and the second insulating zones (IZ2) lie on the first preliminary outer contact side (PCP1). Then, the stack is pressed and separated along the schematically shown separating lines (SL) and sintered such that one or more main body arrangements (SBA) are provided.

Figure 2:
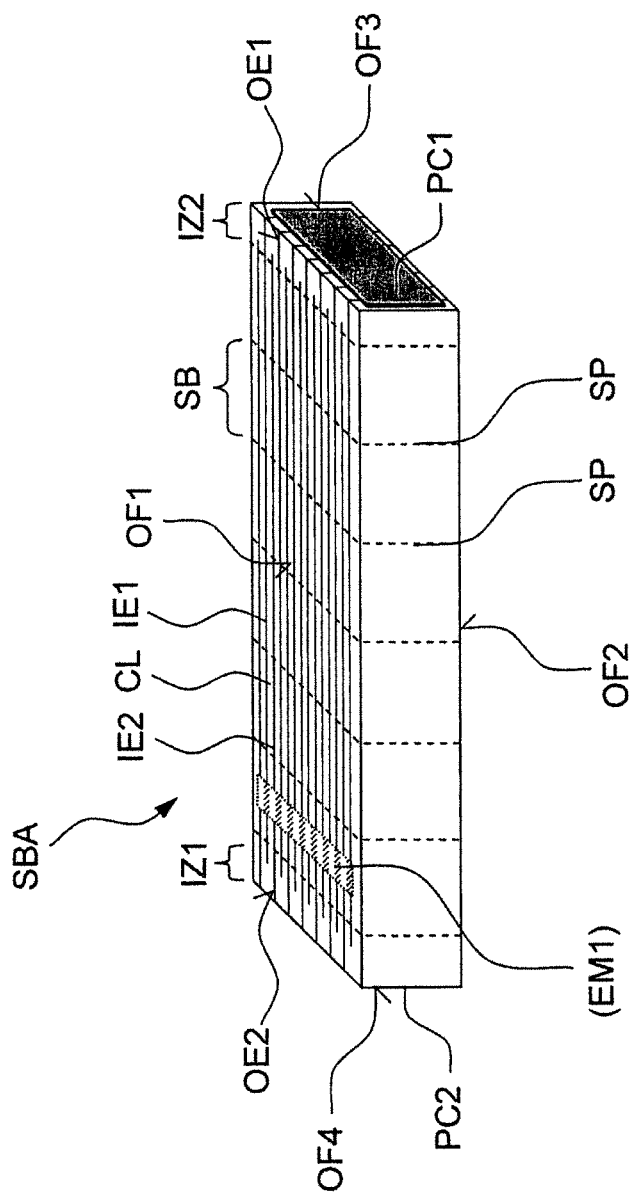
FIG. 2 shows an example for a main body arrangement.

FIG. 2 shows a main body arrangement (SBA) with reference to which the further method will be explained by way of example. The arrangement is in the form of a monolithic sintered body with multi-layer technology. The ceramic layers (CL) and the internal electrodes (IE1, IE2) are arranged one on top of another along a stacking direction. Here, first internal electrodes (IE1) and second internal electrodes (IE2) are arranged one on top of another in alternation between the ceramic layers (CL). The first outer edges (OE1) of the first internal electrodes (IE1) are pulled out onto a third outer surface (OF3) where they are electrically contact-connected collectively by a first preliminary outer contact-making means (PC1). The third outer surface (OF3) therefore corresponds to the side of the first preliminary outer contact side (PCP1). The second outer edges (OE2) of the second internal electrodes (IE2) are spaced apart from the third outer surface (OF3) in an electrically insulating manner by the second insulating zone (IZ2). The second outer edges (OE2) of the second internal electrodes (IE2) are pulled out onto a fourth outer surface (OF4) and are electrically contact-connected collectively by a second preliminary outer contact-making means (PC2). The fourth outer surface (OF4) therefore corresponds to the side of the second preliminary outer contact side (PCP2). The first outer edges (OE1) are spaced apart from the fourth outer surface (OF4) in an electrically insulating manner by the first insulating zone (IZ1). The first and second outer edges (OE1, OE2) are located on a first outer surface (OF1) and a second outer surface (OF2).

Moreover, FIG. 2 indicates, by way of example, a first outer contact-making means (EM1). Schematic separating lines (SP) denote, by way of example, those sites at which the main body arrangement can be separated into individual main bodies (SB) in a later method step after the outer contact-making means has been applied. The separating lines also denote, by way of example, the sectional plane for FIGS. 4A to C.

Figure 3:
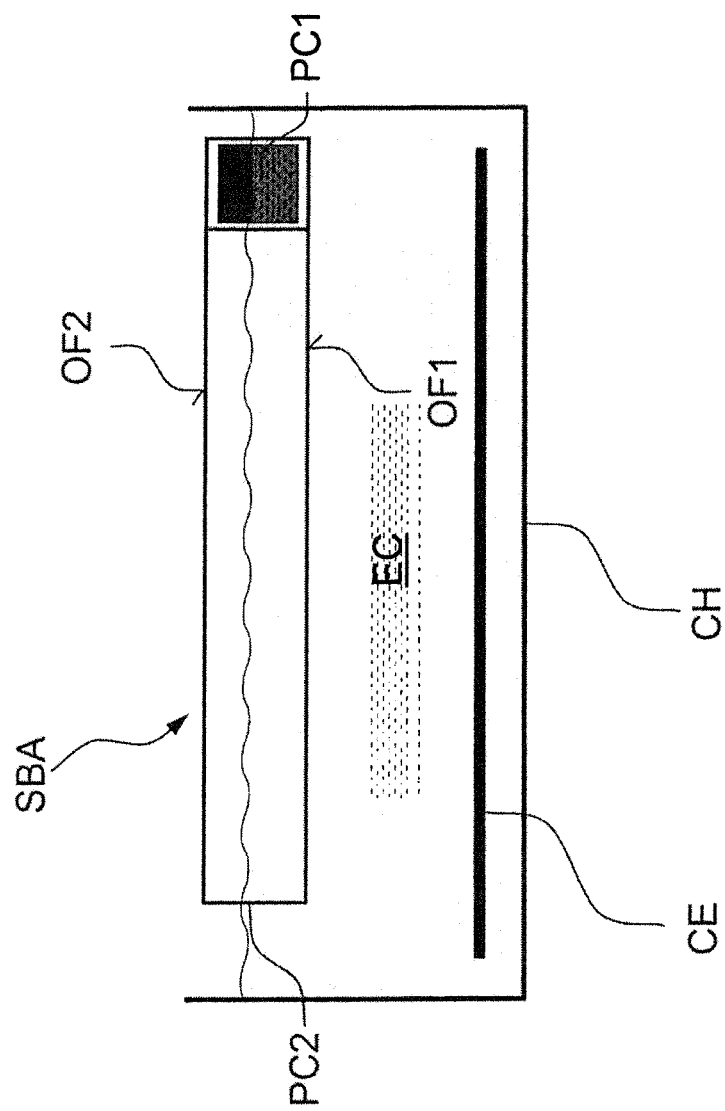
FIG. 3 shows an arrangement for the electrophoretic deposition of the insulating material.

FIG. 3 shows a possible arrangement for the electrophoretic deposition of the insulating material on the outer edges of the internal electrodes on the outer surfaces of the main body (SB) or of the main body arrangement (SBA). The arrangement comprises a chamber (CH) which contains the composition (EC) comprising an electrophoretically mobile insulating material (IM). The insulating material used is finely ground powder of lead-silicate glass having a particle size of approximately one to two micrometers. By addition of polycationic poly(diallyldimethyl)ammonium chloride (PDADMAC), the glass particles are dispersed in the solvent, water or ethanol, and obtain a positive net charge such that they can be propelled through an electric field. In addition, a counterelectrode (CE) is located in the chamber in contact with the composition. The counterelectrode is, for example, an electrode made of copper or palladium.

The main body arrangement described in FIG. 2 is first brought into contact with the composition (EC) by way of the first outer surface (OF1). Next, an electric field is generated in which a negative first electrical potential is applied to the first internal electrodes (IE1) via the first preliminary outer contact (PC1) and a positive third electrical potential is applied to the counterelectrode (CE). A positive second electrical potential is applied to the second internal electrodes (IE2) via the second preliminary outer contact-making means (PC2). The second electrical potential is chosen to be of smaller absolute value than the third electrical potential. By way of example, the voltage at the counterelectrode is 0 V, the voltage at the second internal electrodes is 30 V and the voltage at the first internal electrodes is 60 V. The electrophoretically mobile insulating material then migrates in accordance with its positive net charge along the electric field to the first outer edges of negative polarity, where it is deposited. The positive second electrical potential has the effect that the electrophoretically mobile material is electrically repelled in the immediate vicinity of the second outer edges and is deflected toward the first outer edges. In this way, the electrophoretically mobile insulating material is deposited substantially only on the first outer edges, without further regulating steps, for example, prepatterning or repatterning, being required.

After deposition of the insulating material on the first outer edges, the main body arrangement is dried and the method is repeated correspondingly with the second outer surface such that the insulating material is deposited on the second outer edges on the second outer surface (OF2). For this purpose, use is made of the same composition as for the coating of the first outer edges, in that a negative second electrical potential is applied to the second internal electrodes (IE2) via the second preliminary outer contact (PC2) and a positive third electrical potential is applied to the counterelectrode (CE). At the same time, a positive first electrical potential is applied to the first internal electrodes (IE1) via the first preliminary outer contact-making means (PC1), the absolute value of said positive first electrical potential being chosen to be smaller than the third electrical potential. Alternatively, it would also be possible, however, to choose a different composition, for example using a polyanionic dispersant. For this purpose, it is possible, for example, to apply a positive second electrical potential and a negative third electrical potential, and also a negative first potential, the absolute value of which is smaller than the third electrical potential.

The method ensures reliable insulation of the first or second outer edges on the outer surfaces of the main body. At the same time, the electrophoretic patterning prevents two or more adjacent outer edges from being covered with insulating material in this special design with alternating first and second outer edges. Incorrect contact-connections can thereby be avoided in a particularly advantageous manner.

After deposition of the insulating material on the second outer surface, the insulating material is decarburized at 450° C. for 1 hour and then burned in an adhering manner at 800° C. for 0.5 hour. The burning-in process gives the insulating layers the characteristic rounded cross section. Then, first electrical outer contact-making means (EM1) are applied to the individual main bodies of the main body arrangement and burned in via the insulating layer of the first outer edges on the first outer surface and also second electrical outer contact-making means (EM2) are applied to the individual main bodies of the main body arrangement and burned in via the insulating layer of the second outer edges on the second outer surface. Alternatively, the deposits of the insulating material and the electrical outer contact-making means can also be burned in a common step. Then, the arrangement is separated into individual ceramic components. As a result of the separation, the components are present as a fully active piezoactuator since the internal electrodes cover the entire cross-sectional area of the main body, i.e. the piezoelectric layers are covered completely by the internal electrodes. On account of the advantageous main body arrangement, there is only minor cutting loss during the separation, and this remains restricted substantially to the first and second insulating zones.

FIGS. 4A to 4C each show in a side view a section of a component in various intermediate states during method steps b), c) and d). The sectional plane corresponds to a section in the region of the first outer surface (OF1) along a separating line (SP) shown in FIG. 2. FIG. 4A shows how the deposition of the particles of the insulating material (IM) has taken place in method step b) substantially on the outer edges of the first internal electrodes (IE1) on the first outer surface (OF1), whereas no insulating material has been deposited on the second outer edges of the second internal electrodes (IE2). The particles of the insulating material still comprise polyionic dispersant (PD). FIG. 4B shows the intermediate state in method step c), after the insulating layer (IS) has been produced over the first outer edges by the decarburization and burning-in of the insulating material. The particles of the insulating material are fused in an adhering manner with the first outer surface to form ridges with a rounded cross section. Only the first outer edges are covered in an electrically insulating manner by the insulating layer, whereas the second outer edges are exposed and have the ability to be contact-connected for the electrical outer contact-making means. FIG. 4C shows the intermediate state in method step d), after the first outer contact-making means (EM1) has been applied to the first outer surface. The first outer contact-making means is in electrical contact with the exposed second outer edges, whereas the first outer edges are electrically insulated from the first outer contact-making means by the insulating layer (IS).

The invention claimed is:

1. A method of producing a ceramic component comprising:
    a) providing a main body having internal electrodes comprising at least one first internal electrode having first outer edges and at least one second internal electrode having second outer edges and the first and second outer edges are located on at least the first outer surface of the main body,
    b) contacting the first outer surface of the main body with a composition comprising an insulating material and electrophoretically depositing the insulating material on the first outer edges of the first internal electrodes on the first outer surface of the main body, and not on the second outer edges of the second internal electrodes,
    in said contacting step b) of further comprising applying a first electrical potential to the first internal electrodes and applying a second electrical potential to the second internal electrodes, and the first and second electrical potentials are of opposing polarity, and applying a third electrical potential to at least one counterelectrode related to the first and second internal electrodes, and the first and third electrical potentials are of opposing polarity and the absolute value of the potential of the third electrical potential is chosen to be greater than the absolute value of the potential of the second electrical potential, and c) forming an insulating layer from the insulating material on the outer edges of the internal electrodes.

2. The method according to claim 1, wherein the first and second outer edges are additionally located on at least one further second outer surface of the main body, after the contacting step b) contacting the second outer surface with a composition, and the insulating material on the second outer surface is deposited only on the second outer edges and not on the first outer edges.

3. The method according to claim 2, wherein the composition comprises a polycationic dispersant, and in b) the internal electrodes intended for the deposition of the electrophoretically mobile insulating material are connected as a cathode.

4. The method according to claim 2, further comprising in a), providing a main body arrangement comprising the ceramic main body, and the arrangement additionally has a third and a fourth outer surface, the first outer edges are additionally located on the third outer surface and are present spaced apart from the fourth outer surface by a first insulating zone, the second outer edges are additionally located on the fourth outer surface and are present spaced apart from the third outer surface by a second insulating zone.

5. The method according to claim 4, wherein electrical contact is made with the first outer edges by a first preliminary outer contact provider on the third outer surface and electrical contact is made with the second outer edges by a second preliminary outer contact provider on the fourth outer surface.

6. The method according to claim 1, after the contacting in said step b) further comprising applying at least one first electrical outer contact provider to at least the first outer surface of the main body in electrical contact with the second outer edges over the insulating layer of the first outer edges.

7. The method according to claim 6, wherein b) and c) are effected and only thereafter, applying at least one first electrical outer contact provider to at least the first outer surface of the main body in electrical contact with the second outer edges over the insulating layer of the first outer edges, is effected.

8. The method according to claim 2, further comprising applying at least one second electrical outer contact provider to at least the second outer surface of the main body in electrical contact with the first outer edges over the insulating layer of the second outer edges.

9. The method according to claim 1, wherein the composition contains the following components: particles of the insulating material, a polyionic dispersant and solvent, and the polyionic dispersant disperses the particles in the solvent to form the electrophoretically mobile insulating material.

10. The method according to claim 9, wherein the particles of the insulating material comprise particles of at least one electrically insulating material selected from the group consisting of glass, ceramic, temperature-resistant plastic and combinations thereof.

11. The method according to claim 9, wherein the composition comprises a polyanionic dispersant, and in b) the internal electrodes intended for the deposition of the electrophoretically mobile insulating material are connected as an anode.

12. The method according to claim 1, wherein the main body comprises a piezoceramic material.

* * * * *